(12) United States Patent
Sinsheimer

(10) Patent No.: US 11,855,376 B2
(45) Date of Patent: Dec. 26, 2023

(54) COAXIAL CONTACT HAVING AN OPEN-CURVE SHAPE

(71) Applicant: Teradyne, Inc., North Reading, MA (US)

(72) Inventor: Roger A. Sinsheimer, North Reading, MA (US)

(73) Assignee: Teradyne, Inc., North Reading, MA (US)

( * ) Notice: Subject to any disclaimer, the term of this patent is extended or adjusted under 35 U.S.C. 154(b) by 366 days.

(21) Appl. No.: 17/211,453

(22) Filed: Mar. 24, 2021

(65) Prior Publication Data

US 2022/0311166 A1 Sep. 29, 2022

(51) Int. Cl.
*H01R 13/24* (2006.01)
*G01R 1/067* (2006.01)
*H01R 9/05* (2006.01)
*H01R 13/6582* (2011.01)

(52) U.S. Cl.
CPC ..... *H01R 13/2428* (2013.01); *G01R 1/06722* (2013.01); *G01R 1/06777* (2013.01); *H01R 9/05* (2013.01); *H01R 13/6582* (2013.01); *H01R 2201/20* (2013.01)

(58) Field of Classification Search
CPC ............. H01R 13/2428; H01R 13/646; H01R 13/6473; H01R 13/648; H01R 13/658; H01R 24/38; H01R 24/40; H01R 24/50; H01R 13/6582; H01R 9/05; H01R 2201/20; G01R 1/06722; G01R 1/06777
See application file for complete search history.

(56) References Cited

U.S. PATENT DOCUMENTS

| | | |
|---|---|---|
| 5,471,148 A | 11/1995 | Sinsheimer et al. |
| 5,528,158 A | 6/1996 | Sinsheimer et al. |
| 6,027,346 A | 2/2000 | Sinsheimer et al. |
| 6,107,813 A | 8/2000 | Sinsheimer et al. |
| 6,166,553 A | 12/2000 | Sinsheimer |
| 6,833,696 B2 | 12/2004 | Sinsheimer et al. |
| 6,888,427 B2 | 5/2005 | Sinsheimer et al. |
| 6,963,211 B2 | 11/2005 | Sinsheimer et al. |
| 7,078,890 B2 | 7/2006 | Sinsheimer et al. |
| 7,084,656 B1 * | 8/2006 | Khandros ............... H01L 24/14 324/755.05 |
| 7,295,024 B2 | 11/2007 | Sinsheimer |
| 7,358,754 B2 | 4/2008 | Sinsheimer et al. |

(Continued)

*Primary Examiner* — Oscar C Jimenez
*Assistant Examiner* — Paul D Baillargeon
(74) *Attorney, Agent, or Firm* — Burns & Levinson LLP

(57) ABSTRACT

An example contact head includes coaxial contacts configured for transmission of radio frequency (RF) signals or digital signals between a test system and a device under test (DUT). Each of the coaxial contacts is configured to target a specific impedance. Each of the coaxial contacts includes a coaxial structure having an open-curve shape. The coaxial structure includes a spring material that bends in response to applied force and that returns to the open-curve shape absent the applied force. The coaxial structure includes a center conductor terminating in a contact pin and a return conductor separated by a dielectric from the center conductor. At least part of the center conductor and the return conductor include an electrically-conductive material. Flexible contacts on the coaxial contact include the electrically-conductive material.

37 Claims, 9 Drawing Sheets

(56) References Cited

U.S. PATENT DOCUMENTS

| | | |
|---|---|---|
| 9,435,855 B2 | 9/2016 | Lewinnek et al. |
| 9,594,114 B2 | 3/2017 | Sinsheimer |
| 9,786,977 B2 | 10/2017 | Lyons et al. |
| 10,060,475 B2 | 8/2018 | Sinsheimer et al. |
| 10,451,652 B2 | 10/2019 | Sinsheimer et al. |
| 10,972,192 B2 | 4/2021 | Wadell et al. |
| 2002/0050388 A1* | 5/2002 | Simpson ............... H01R 13/24 174/88 C |
| 2004/0135656 A1 | 7/2004 | Sinsheimer et al. |
| 2004/0174174 A1 | 9/2004 | Sinsheimer et al. |
| 2005/0046411 A1 | 3/2005 | Sinsheimer et al. |
| 2005/0264311 A1 | 12/2005 | Sinsheimer et al. |
| 2006/0183377 A1 | 8/2006 | Sinsheimer |
| 2006/0244471 A1 | 11/2006 | Sinsheimer et al. |
| 2007/0126439 A1 | 6/2007 | Sinsheimer et al. |
| 2007/0176615 A1 | 8/2007 | Sinsheimer |
| 2008/0025012 A1 | 1/2008 | Sinsheimer |
| 2008/0030211 A1 | 2/2008 | Sinsheimer |
| 2008/0030212 A1 | 2/2008 | Sinsheimer |
| 2008/0030213 A1 | 2/2008 | Sinsheimer |
| 2012/0152309 A1 | 6/2012 | Miller et al. |
| 2015/0137848 A1 | 5/2015 | Lewinnek et al. |
| 2015/0377946 A1 | 12/2015 | Sinsheimer |
| 2016/0018442 A1 | 1/2016 | Sinsheimer et al. |
| 2016/0131702 A1 | 5/2016 | Sinsheimer |
| 2016/0186804 A1 | 6/2016 | Sinsheimer et al. |
| 2017/0170537 A1 | 6/2017 | Lyons et al. |
| 2019/0349096 A1 | 11/2019 | Wadell et al. |
| 2020/0403364 A1* | 12/2020 | Schütt ................. H01R 43/16 |

\* cited by examiner

COAXIAL CONTACT HAVING AN OPEN-CURVE SHAPE

TECHNICAL FIELD

This specification is directed to example coaxial contacts, such as probes, that include a spring material and flexible contacts.

BACKGROUND

Test systems are configured to test the operation of electronic devices referred to as devices under test (DUTs). A test system may include test instruments to send signals, including digital and analog signals, to a DUT for testing. The test system may include contacts for contacting an electronic device in order to create electrical connections for transmitting signals to, and receiving signals from, the electronic device.

SUMMARY

An example contact head includes coaxial contacts configured for transmission of radio frequency (RF) signals or digital signals between a test system and a device under test (DUT). Each of the coaxial contacts is configured to target a specific impedance. Each of the coaxial contacts includes a coaxial structure having an open-curve shape. The coaxial structure includes a spring material that bends in response to applied force and that returns to the open-curve shape absent the applied force. The coaxial structure includes a center conductor terminating in a contact pin and a return conductor separated by a dielectric from the center conductor. At least part of the center conductor and the return conductor include an electrically-conductive material. Flexible contacts on the coaxial contact include the electrically-conductive material. The flexible contacts are electrically connected to the return conductor. The example contact head may include one or more of the following features, either alone or in combination.

The coaxial structure may create an impedance-controlled environment that supports substantially lossless transmission of the RF signals or the digital signals. The coaxial structure may have one of a rectangular or a circular in cross-section. The dielectric may include air, polytetrafluoroethylene (PTFE), and/or a mix of non-conductive dielectric material and air. The dielectric may include alternating dielectric materials. The dielectric may include air and a solid dielectric material to support the inner conductor. The conductive material may be plated over the spring material. A precious metal may be plated over the conductive material.

The spring material may be plated over the conductive material. The spring material may include nickel or nickel-cobalt. The conductive material may include copper. The coaxial structure may be configured to enable substantially lossless transmission of signals that exceed 10 gigahertz (GHz) in frequency. The contact head may be for a single die. Spring contacts may be configured for transmission of at least one of power or control signals between a test system and the DUT.

The center conductor may be a first center conductor and the coaxial structure may include a second center conductor terminating in a contact pin. The first center conductor and the second center conductor support differential signals.

An apparatus may include multiple contact heads, each of which may be or include a contact head. An example contact head may include coaxial contacts configured for transmission of RF signals or digital signals between a test system and a DUT. Each of the coaxial contacts is configured to target a specific impedance. Each of the coaxial contacts includes a coaxial structure having an open-curve shape. The coaxial structure includes a spring material that bends in response to applied force and that returns to the open-curve shape absent the applied force. The coaxial structure includes a center conductor terminating in a contact pin and a return conductor separated by a dielectric from the center conductor. At least part of the center conductor and the return conductor include an electrically-conductive material. Flexible contacts include the electrically-conductive material. The flexible contacts are electrically connected to the return conductor.

The apparatus further includes first alignment features and a retention plate configured to maintain the multiple contact heads in a predefined spatial relationship. The retention plate includes second alignment features that mate to the first alignment features. The example apparatus may include one or more of the following features, either alone or in combination.

The retention plate may include a rigid material such as borosilicate glass. Each of the multiple contact heads may include a support block to hold the coaxial structure and the first alignment features. The retention plate may include a material having a same coefficient of thermal expansion as a material included in a DUT to be contacted by a contact head. The retention plate may include holes, each of which is for fitting at least part of one of the multiple contact heads.

Each of the multiple contact heads may include three first alignment features configured to mate to three corresponding second alignment features on the retention plate. Each of the multiple contact heads may include multiple first alignment features configured to mate to multiple corresponding second alignment features on the retention plate. The retention plate is may be to enable replacement of at least one of the contact heads. Each of the multiple contact heads may include coaxial connectors configured to connect to mating coaxial connectors for transmission of RF signals or digital signals.

The apparatus may include an interface board through which each of the mating coaxial connectors passes. The interface board may be configured to hold the mating coaxial connectors without signals therethrough passing through conductive paths located on the interface board.

The dielectric may include air and/or PTFE. The conductive material may be plated over the spring material. A precious metal maybe plated over the conductive material. The spring material may include nickel or nickel-cobalt, the conductive material may include copper, and the precious metal may include gold. The spring material may include nickel-cobalt and the precious metal may include gold.

The coaxial contacts may be or include coaxial probes. The contact head may be or include a probe head. The coaxial contacts may be configured for wafer-level testing. The coaxial contacts may be configured for package-level testing.

Two or more of the features described in this specification, including in this summary section, may be combined to form implementations not specifically described in this specification.

At least part of the systems and techniques, components, and variations thereof described in this specification may be configured or controlled by executing, on one or more processing devices, instructions that are stored on one or more non-transitory machine-readable storage media.

Examples of non-transitory machine-readable storage media include read-only memory, an optical disk drive, memory disk drive, and random access memory. At least part of the systems and techniques, components, and variations thereof described in this specification may be configured or controlled using a computing system comprised of one or more processing devices and memory storing instructions that are executable by the one or more processing devices to perform various control operations. The systems and techniques, components, and variations thereof described herein may be configured, for example through design, construction, arrangement, placement, programming, operation, activation, deactivation, and/or control.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Figure 1:
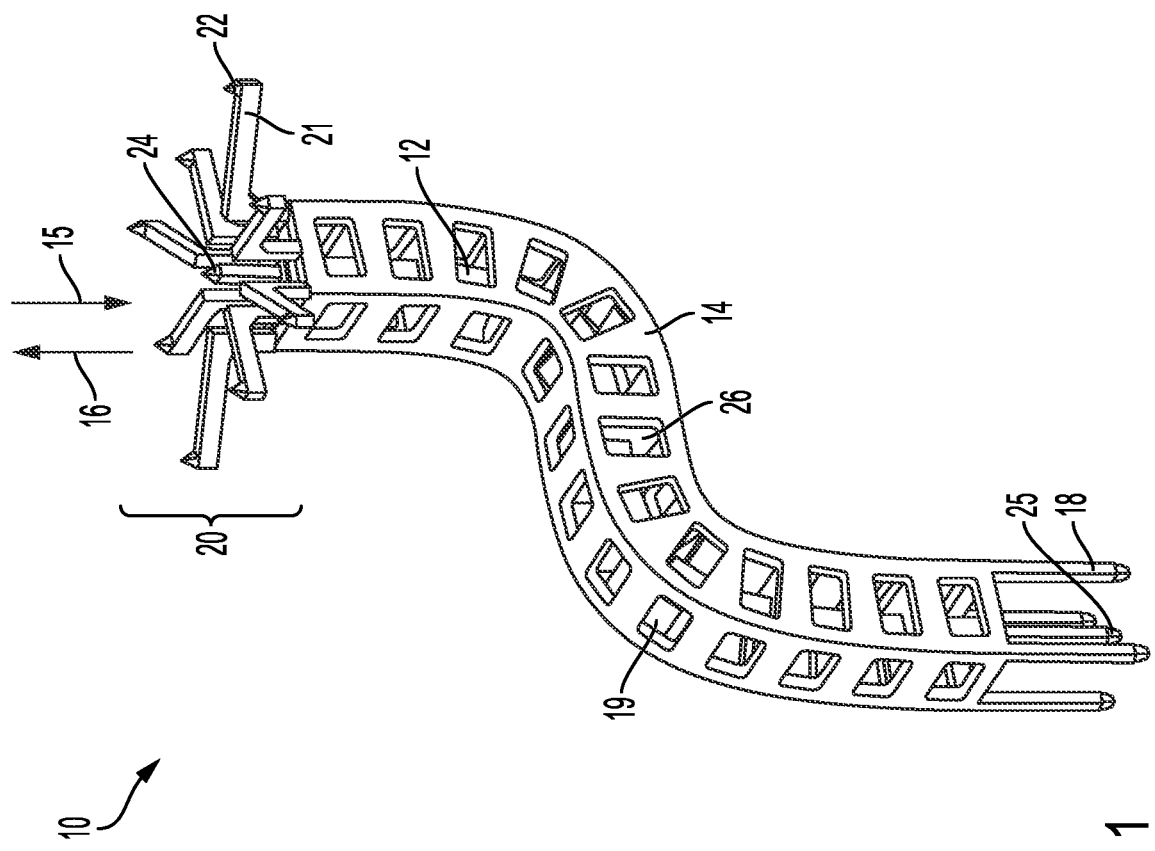
FIG. 1 show a perspective view of an example coaxial contact.

Test systems are configured to test the operation of electronic devices referred to as devices under test (DUTs). As described below, a test system may include test instruments to send signals, including digital and analog signals, to a DUT for testing. Test systems may be configured to perform wafer-level testing. A wafer may include a semiconductor wafer on which electronic devices, such as integrated circuits, are formed. Wafer-level testing may include testing the electronic devices before the electronic devices have been separated from the wafer.

To implement wafer-level testing, a test system may include a test contact head having contacts for contacting electronic devices on a semiconductor wafer in order to create electrical connections for transmitting signals to, and for receiving signals from, electronic devices on the wafer. In the context of wafer-level testing, the entire wafer may be considered to be the DUT or the individual electronic devices on the wafer may be considered to be the DUT.

During testing, the wafer and electrical contacts on a contact head are brought into physical contact. A contact card, such as a probe card, a socket board, or a device interface board, may hold one or more contact heads having individual electrically-conductive contacts thereon for making electrical connections to electrical contacts on electronic devices on the wafer. Examples of contact heads include probe heads and examples of electrically-conductive contacts include probes on the probe heads. Multiple contact heads may be included on the contact card in order to test multiple wafer concurrently—for example, one contact head to test one wafer. Accordingly, one or more contact heads—for example probe heads—are on the contact card, and each contact head includes multiple contacts—for example, probes—to make electrical connections to a DUT.

The concepts described herein apply also in package-level testing or "final test". Package-level testing includes testing electronic devices after the electronic devices have been separated from the wafer and packaged for distribution. The electronic devices may be arranged to enable contacts on the contact card to connect to electrical contacts on the electronic devices in order to perform testing.

In both wafer testing and package testing, the contact card does not move. That is, it is stationary and the DUT is brought to the contact card. In the case of wafer testing the wafer sits on a chuck (a flat platen) and is addressed to dangling contacts on the contact card. In the case of package testing, the contact card (socket board) is fixedly mounted to the packaged device handler and the DUTs are pressed and held into the socket or sockets by a robot within a handler.

In the following description, wafer-level testing is used to illustrate the devices and methods described herein even though they are broadly applicable.

In order to make the electrical connections, force is applied between a contact head and a wafer, thereby forcing electrical contacts on the contact head into electrical connection with electrical contacts on the wafer. In some cases, the electrical contacts on the wafer are not uniform in height, which can affect the quality or even existence of electrical connections between the electrical contacts on the contact head and the contacts on the wafer. Accordingly, the example contacts on the contact head described herein—referred to herein as "head contacts" to differentiate them from DUT contacts—include a spring material that allows the head contacts to flex to accommodate electrical contacts on a wafer having different heights. In addition, the head contacts are coaxial contacts configured for transmission of radio frequency (RF) signals or digital signals between a test system and a DUT. The head contacts are configured to target a specific impedance—for example, to create an impedance-controlled environment. For example, the head contacts may be configured to create a 500 impedance-controlled environment. Head contacts such as these may allow transmission of signals over relatively high frequency ranges such as 50 gigahertz (GHz) to 70 GHz or more. Spring pins, by contrast, may act as low-pass filters and cut-off signals in these frequency ranges.

Accordingly, described herein are head contacts configured to target a specific impedance. An example head contact includes a coaxial structure having an open-curve shape. The coaxial structure includes a spring material that bends in response to applied force and that returns to the open-curve shape absent the applied force. The coaxial structure includes an inner conductor terminating in a contact pin and a return conductor separated by a dielectric from the inner conductor. At least part of the inner conductor and the return conductor include an electrically-conductive material. The example head contact also includes flexible contacts that include the electrically-conductive material. The flexible contacts are electrically connected to the return conductor and may facilitate connection to contacts that have a non-uniform height. The coaxial contacts may be part of a contact head, which may be one of multiple contact heads on a test contact head.

FIG. 1 shows an example implementation of a head contact 10. As shown in FIG. 1, head contact 10 has a coaxial structure, which includes an inner conductor 12 and a return conductor 14. In this example, return conductor 14 has a cross-sectional rectangular shape; accordingly, the resulting structure may be referred to as "rectax" ("rectangular coaxial"). However, return conductor 14 is not limited to a cross-sectional rectangular shape and may instead have a circular cross-sectional shape or any other appropriate cross-sectional shape that achieves a target specific impedance. Return conductor 14 includes a spring material that bends in response to applied force and that returns to its original shape absent the applied force or in response to a reduction in the amount of the applied force.

Examples of spring material that may be included in return conductor 14 include, but are not limited to, nickel or nickel-cobalt. The return conductor also includes an electrically-conductive material such as copper that is in contact with the spring material. The electrically-conductive material functions as the primary electrical return path for coaxial contact 10. In some implementations, the spring material is plated over the electrically-conductive material. In some implementations, the electrically-conductive material is plated over the spring material. Return conductor 14 may also include a precious metal, such as gold, in its structure. The precious metal may be plated over the electrically-conductive material, over the spring material, or over both the electrically-conductive material and the spring material.

The spring material in return conductor 14 enables the return conductor, and therefore head contact 10, to bend in response to applied force and to return to the open-curve shape absent the applied force or a reduction in the applied force. Head contact 10 is configured to bend in the direction of applied force. For example, force applied to create an electrical connection may be generally in the direction of arrow 15, allowing head contact 10 to bend from its original (no force applied) open curve shape in the general direction of arrow 15 and return to its original open curve shape through opposite movement in the general direction of arrow 16. Because head contact 10 includes spring material, head contact 10 returns to its original open curve shape automatically when the applied force (in the direction of arrow 15) is removed or lessened. That is, no opposite force need be applied to head contact 10 in return it back to its original shape. In an example, head contact 10 provides a range of flexibility of about 75 microns (μm); however, head contact 10 may be configured to provide any appropriate range of flexibility based, for example, on its dimensions and materials.

As shown in FIG. 1, return conductor 14 includes contacts 18 that connect electrically to electrical contacts associated with a test instrument or printed circuit board (PCB)—for example, the contact cards described herein—located between the test instrument and the contact head. In an example, an exposed part of head contact 10 has a length of about 1000 microns (μm); however, head contact 10 may be configured as any appropriate length.

As also shown in FIG. 1, return conductor 14 includes cut-outs such as 19. These cut-outs are a manufacturing artifact for the particular implementation shown and may, or may not, be included on the coaxial contacts described herein.

Return conductor 14 connects electrically to flexible contacts 20 to enable electrical signals to flow between the flexible contacts and return conductor 14, particularly through copper, for example, in the return conductor. In this example, flexible contacts 20 each includes an arm 21 and a contact point 11. Both conduct electrical signals to and from an electrical contact, but the contact point 22 makes the electrical connection to counterpart return electrical contacts on the DUT—for example, to a ground voltage (an electrical reference) on the DUT. In some implementations, each contact point may be or include a tungsten-rhenium tip.

In this example, there are eight flexible contacts 20; however, the number of flexible contacts may be greater than eight or fewer than eight in different implementations. Contacts 20 are flexible in the sense that that they are configured to bend at least in the direction of arrows 15 in response to applied force applied by the test contact head. For example, flexible contacts 20 are configured to bend from their original (no force applied) position to enable electrical connection to counterpart electrical contacts on a DUT, such as a wafer or package. To implement the bending, at least arms 21 may include a spring material such as those described herein and have a layer construction that that is the same as that of return conductor 14. Flexible contacts 20 are configured to return to their original position automatically when the applied force is removed or lessened. That is, no opposite force need be applied to flexible contacts 20 to return them to their original position.

Head contact 10 also includes inner conductor 12. Inner conductor 12 is within a space enclosed by return conductor 14 but separated electrically and physically from return conductor 14 by one or more dielectric materials ("dielectrics") such that there is no electrical contact between inner conductor 12 and return conductor 14. Inner conductor 12 need not be at the geometric center of the space enclosed by return conductor 14; however, inner conductor 12 may be at the geometric center of the space enclosed by return conductor 14 in some implementations. Inner conductor 12 terminates in a contact pin 24, which makes electrical connection to a counterpart electrical contact on the DUT. The counterpart electrical contact on the DUT may have a coaxial structure. In some implementations, contact pin 24 may be or include a tungsten-rhenium tip. Inner conductor 12 also terminates in a second contact pin 25, which connects electrically to electrical contacts associated with a test instrument or PCB (contact card) located between the test instrument and the contact head. Inner conductor 12 may also include flexible and electrically-conductive materials of the type described herein. For example, the flexible material on the inner conductor may be plated over the electrically-conductive material on the inner conductor or the electrically-conductive material may be plated over the flexible material. In either case, at least some of the electrically-conductive material is exposed for electrical connection.

In some implementations, head contact 10 may be a "twinax" contact, in which there is a single return path 14 and two center conductors. This configuration may be used for connecting to a differential pair to support a differential path, which is something that is becoming more important for digital signaling. This configuration may be relatively wider across the contact, not in the direction that it bends.

There maybe one or more dielectrics between return conductor 14 and inner conductor 12. Examples of dielectrics that may be used include, but are not limited to, air and/or polytetrafluoroethylene (PTFE). In an example, the majority of the dielectric is air, with solid dielectric couplings, such as dielectric coupling 26, connected physically to both inner conductor 12 and return conductor 14 to support inner conductor 12 within return conductor 14 and to maintain the relative positioning between inner conductor 12 and return conductor 14. Any appropriate number of these dielectric couplings may be used along the length of coaxial contact 10. The dielectric couplings should be spaced sufficiently far apart to maintain the relative positioning between inner conductor 12 and return conductor 14 without inhibiting, or substantially inhibiting, the flexibility of coaxial contact 10. To this end, dielectric couplings 26 may be made of flexible material.

In some implementations, one or more (for example, all) dielectrics used in coaxial contact 10 may be solid, that is, not include air. In these cases, the dielectrics should be sufficiently flexible so as not to inhibit the flexibility of coaxial contact 10. The dielectrics may include alternating dielectric materials such as alternating layers of PTFE or polyethene (a type of plastic). The dielectrics may include a mixture non-conductive material and air. In general, any appropriate dielectric may be used in coaxial contact 10. In some implementations, different dielectrics may be layered to within coaxial contact 10 to achieve a target impedance.

In this regard, in some implementations, the coaxial structure of head contact 10 creates an impedance-controlled environment that supports substantially lossless transmission of RF signals or digital signals transmitted therethrough. Substantially lossless transmission may include, but is not limited to, signal loss that is less than 1 decibels (dB), less than 2 dB, less than 3 dB, less than 4 dB, less than 5 dB, less than 6 dB, less than 7 dB, less than 8 dB, less than 9 dB, or less than 10 dB. In some implementations, the coaxial structure is configured to enable substantially lossless transmission of digital signals or of RF signals having frequencies that exceed 10 GHz, that exceed 20 GHz, that exceed 30 GHz, that exceed 40 GHz, that exceed 50 GHz, that exceed 60 GHz, or that exceed 70 GHz. In some implementations, head contact 10 is configured for, and enables, transmission, between a test system and a DUT, of power signals, of control signals, or of both power and control signals.

Figure 2:
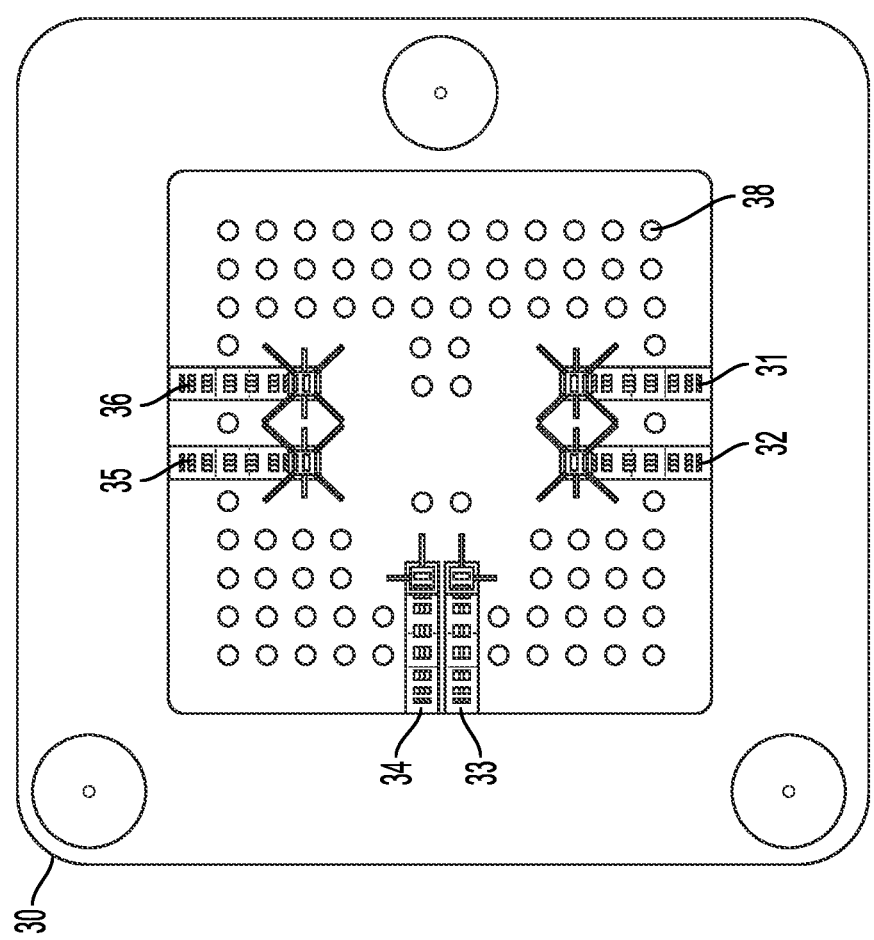
FIG. 2 shows a top view of an example contact head.
Figure 3:
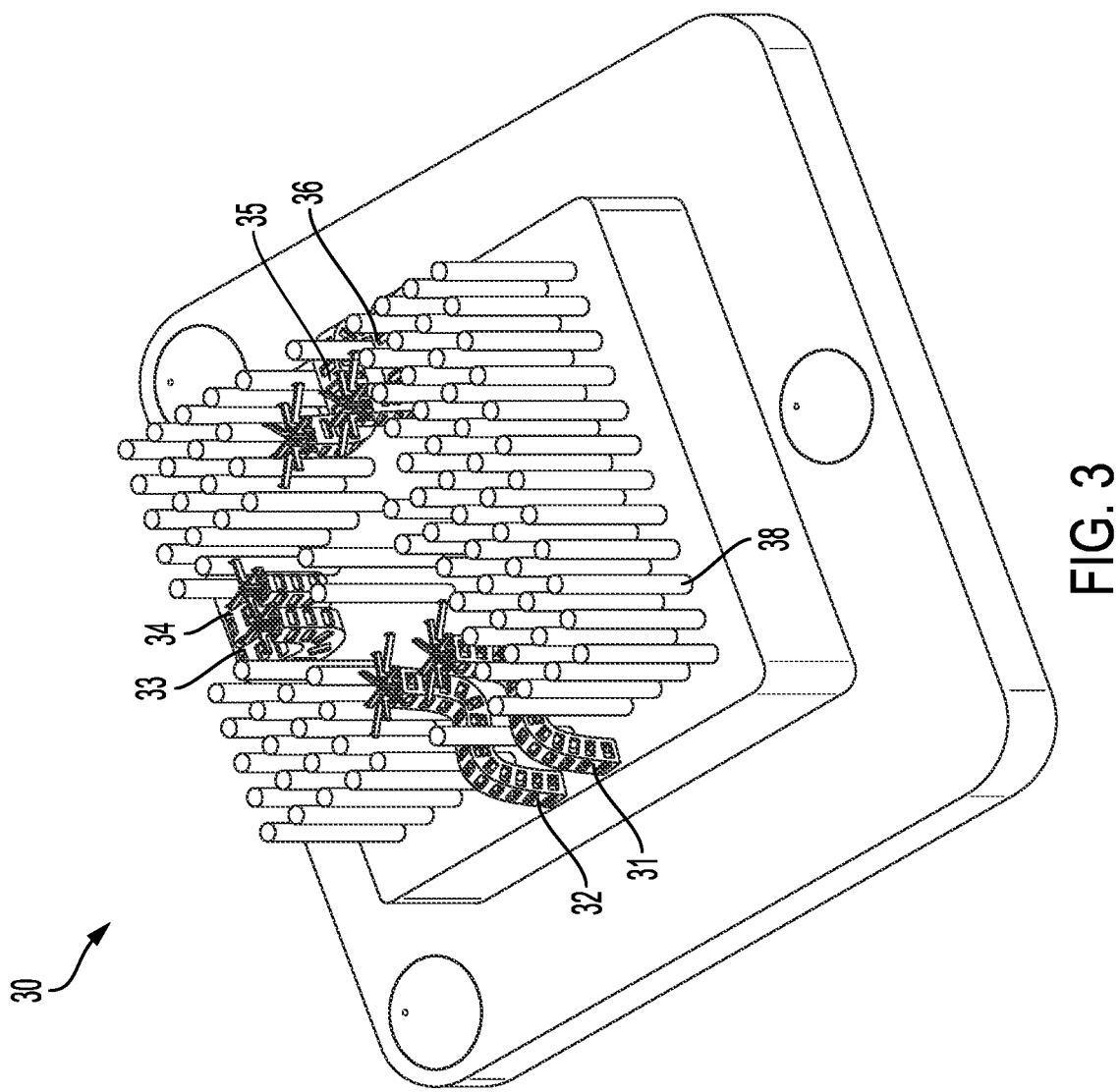
FIG. 3 shows a perspective view of the example contact head of FIG. 2.

Referring to FIGS. 2 and 3, head contact 10 may be part of a contact head 30. The contact head may be for a single die in some implementations. An example die includes a block of semiconducting material upon which integrated circuit parts and functions are fabricated. In this example, there are six head contacts 31 to 36, which may have the same structure and function as head contact 10. Each head contact 31 to 36 is configured to connect electrically to counterpart contacts on a DUT. RF signals or high-speed digital signals, which may include but are not limited to power and/or control signals, may be transmitted over the resulting electrical connections. The remaining electrical connectors 38 on contact head 30 may be, for example, Spring pins or other connectors that may be used, for example, to transmit signals at lower frequencies than those transmitted by the coaxial contacts.

Figure 5:
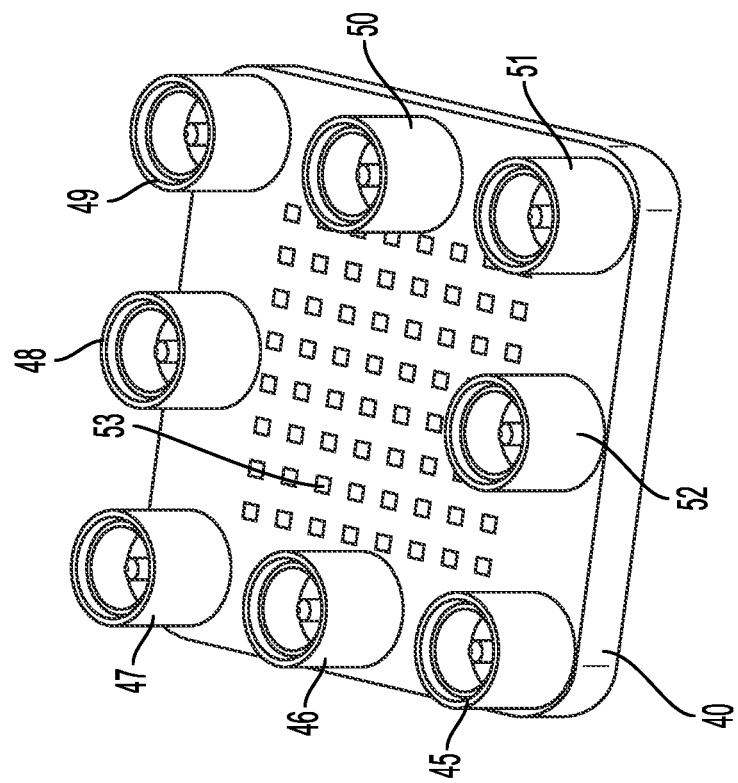
FIG. 5 shows a bottom perspective view of an example contact head and support block combination.
Figure 4:
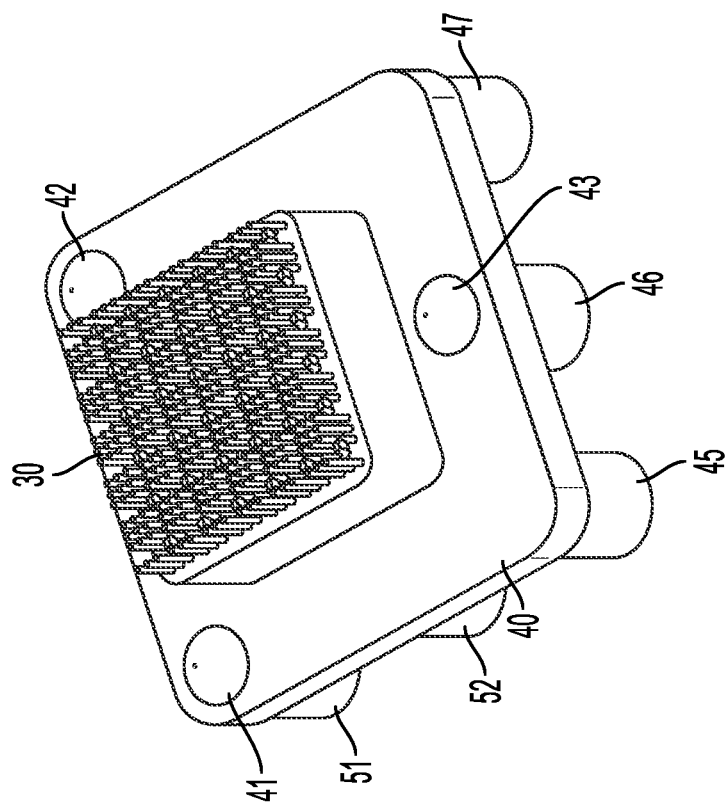
FIG. 4 shows a top perspective view of an example contact head and support block combination.

Referring to FIGS. 4 and 5, example contact head 30 includes a support block 40 that holds coaxial structures and first alignment features 41 to 42, which are used to align the contact head to the retention plate described below. In this regard, FIG. 4 shows the top side of support block 40 and FIG. 5 shows the underside of support block 40. Support block 40 includes coaxial connectors 45, 46, 47, 48, 49, 50, 51, and 52 configured to connect to mating coaxial connectors, which may lead back to a test instrument, for transmission of RF signals or digital signals between the test instruments and a DUT. Support block 40 may also include one or multiplexers (not shown) to route the RF signals or digital signals between the head contacts and coaxial connectors 45 to 52. Electrical contacts 53 make contact between spring pins and a PCB, such as the contact card described herein.

Figure 6:
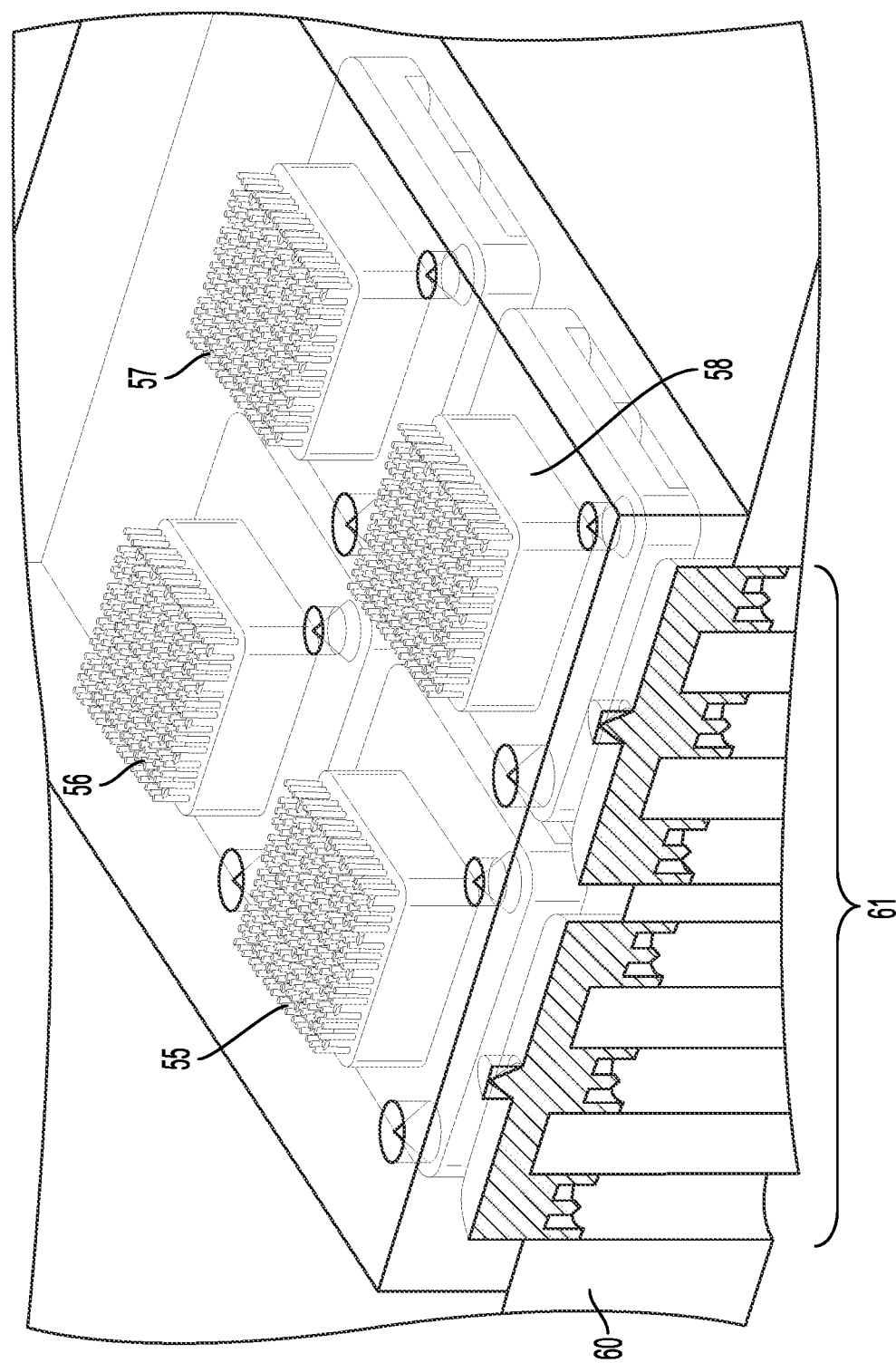
FIG. 6 shows a cut-away perspective view of part of an example contact interface board and example contact heads.

As shown in FIG. 6 contact heads 55 to 58, which may have the same configuration as contact head 30 and support block 40, are connected to and through a device or contact card 60. An example contact card is mechanically docked to the test contact head and electrically connected to a tester. The contact card is configured to provide an electrical path between the tester and electronic devices on the wafer under test. As shown in FIG. 5, contact card 60 is configured to hold coaxial cables (not shown) in slots 61 that mate to coaxial connectors, such as coaxial connectors 45 to 53, of support blocks of contact heads 55 to 58. RF or digital signals are thus routed, for example by the multiplexers described above, between the coaxial cables and head contacts, such as head contact 10 of FIG. 1, on the contact head. In this architecture, RF or digital signals pass directly between the head contacts and the coaxial connectors without passing through conductive paths located on the contact card. This architecture may reduce signal loss and degradation.

Figure 7:
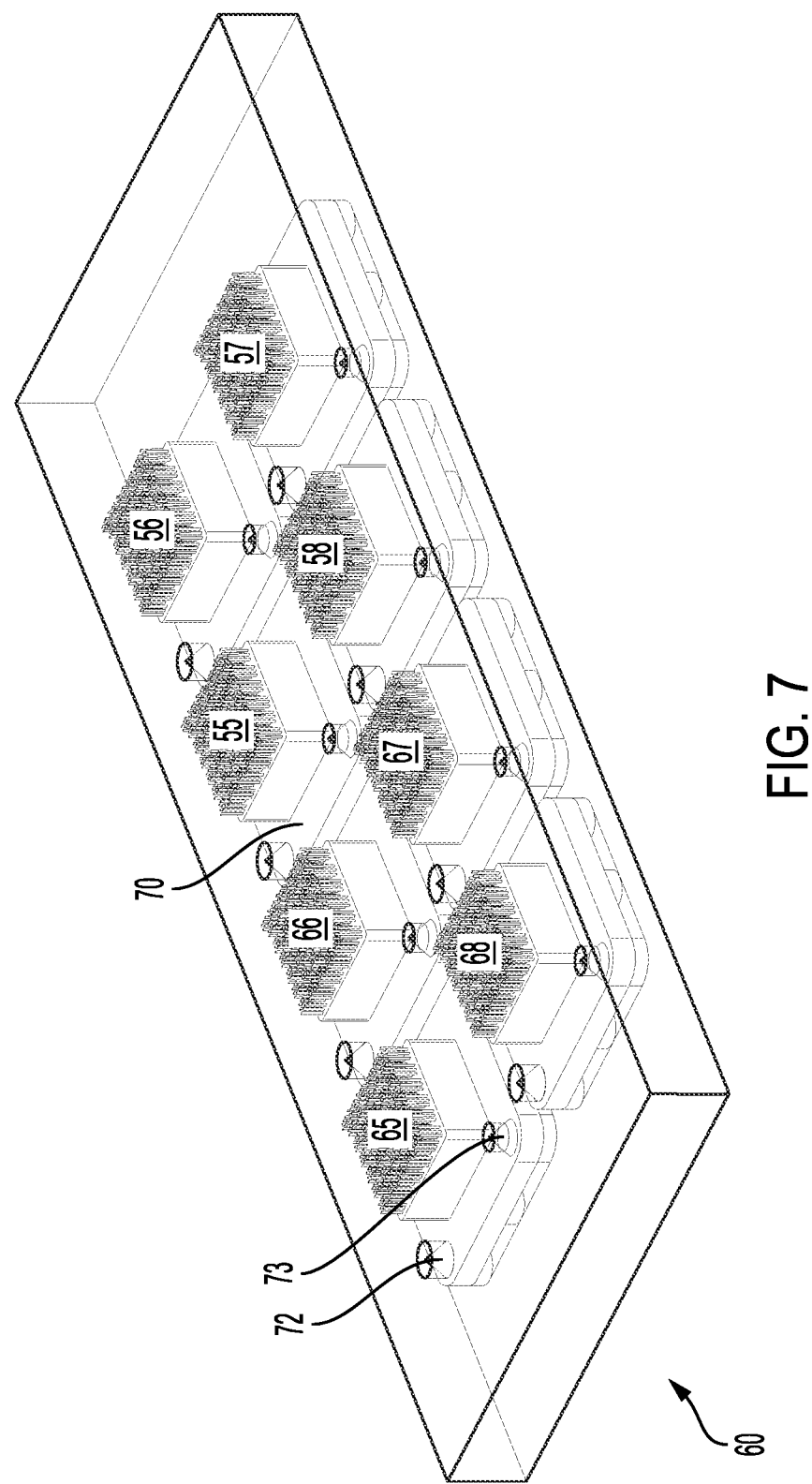
FIG. 7 is a perspective view of a part of an example contact interface board, example contact heads, and an example retention plate.

Referring to FIG. 7, part of a contact card 60, which may be a probe card such as a probe interface card (PIB). In this example, the contact card includes multiple—here eight—contact heads including contact heads 55 to 58 and contact heads 65, 66, 68, and 67. In some implementations, there may be more than eight contact heads or fewer than eight contact heads. One or more of the contact heads 55 to 58 and 65 to 68 may include one or more head contacts that may have the same structure and function as head contact 10. For example, one of the contact heads may have the same structure as contact head 30 of FIGS. 2 and 3. One or more of contact heads 65 to 68 may not include a head contact of the type described herein. For example, one or more of contact heads 65 to 68 may include spring pins only or similar standard connectors.

Figure 8:
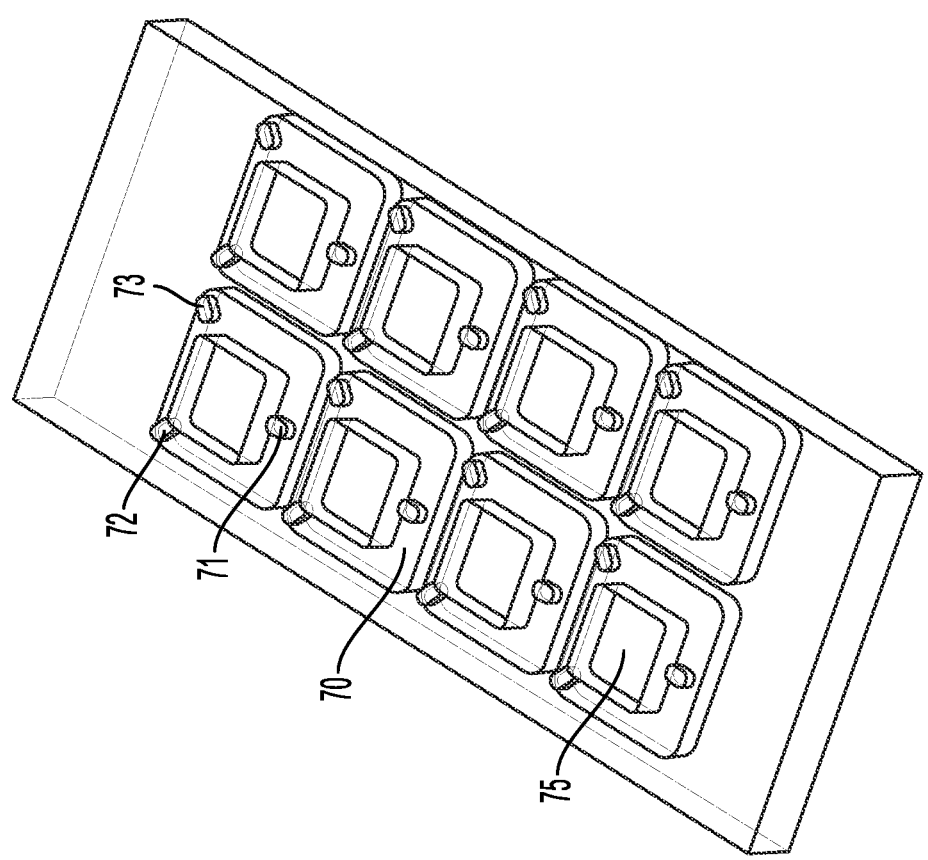
FIG. 8 is a bottom perspective view of the example retention plate.

Referring also to FIGS. 8, the contact heads of FIG. 7 are held in place on the contact by a retention plate 70. Retention plate 70 is configured to maintain the contact heads in a predefined spatial relationship relative to each other. Retention plate 70 may be comprised of a rigid material, such as borosilicate glass. Retention plate 70 may be made of a material that expands and contracts the same amount as a device under test. In other words, the device and the retention plate may have the same, or about the same (e.g., within 5%) coefficient of thermal expansion.

Retention plate 70 includes alignment features such as 71, 72, and 73 that mate to first alignment features, such as 41 to 43 of FIG. 4, of a contact head support block. In some examples, each contact head and corresponding part of the retention plate includes three alignment features; however, more than three alignment features per contact head may be used. The alignment features may be referred to as kinematic features and aid in aligning the contact heads as described below. The alignment features may be shaped as convex cones, in which the male part is on the contact head support structure and the female part is on the retention plate. Other shapes, however, may be used, so long as mating and alignment can be achieved.

As shown in FIG. 7, retention plate includes holes, such as hole 75, each which is for fitting at least part of one of the multiple contact heads, as shown in FIG. 7. Retention plate 70 is removable to enable replacement of one or more of contact heads 55 to 58 or 65 to 68. For example, to replace a damage contact head, coaxial and any other cables to that contact head are disconnected. The retention plate is removed (e.g., lifted-off) from contact card 60 and the damaged contact head is extracted from the PIB. A new contact head is then inserted into the contact card in place of the damaged contact head. The retention plate is replaced such that the alignment features of the retention plate match those of the contact heads installed. The retention plate may include a spring-loaded mechanism holding/aligning it to the contact card. There may also be a springy interposer between the contact card and contacts 53 that push the contact head away from the contact card and towards the retention plate.

Figure 10:
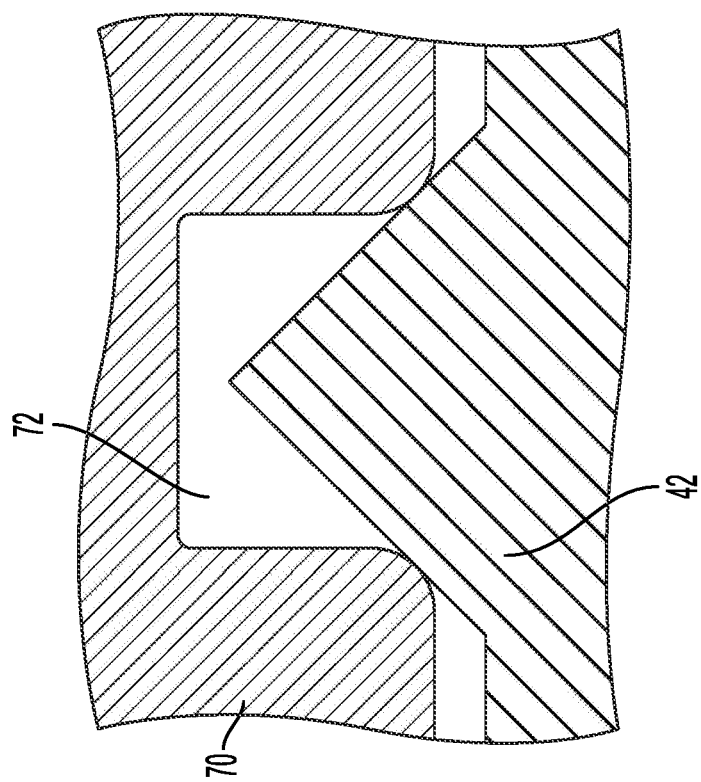
FIG. 10 is a side view of a kinematic connection between an example retention plate and contact head alignment feature.

FIG. 10 shows part of example retention plate 70 in a kinematic coupling between alignment feature 72 on the retention late and alignment feature 42 on the contact head support block.

Figure 9:
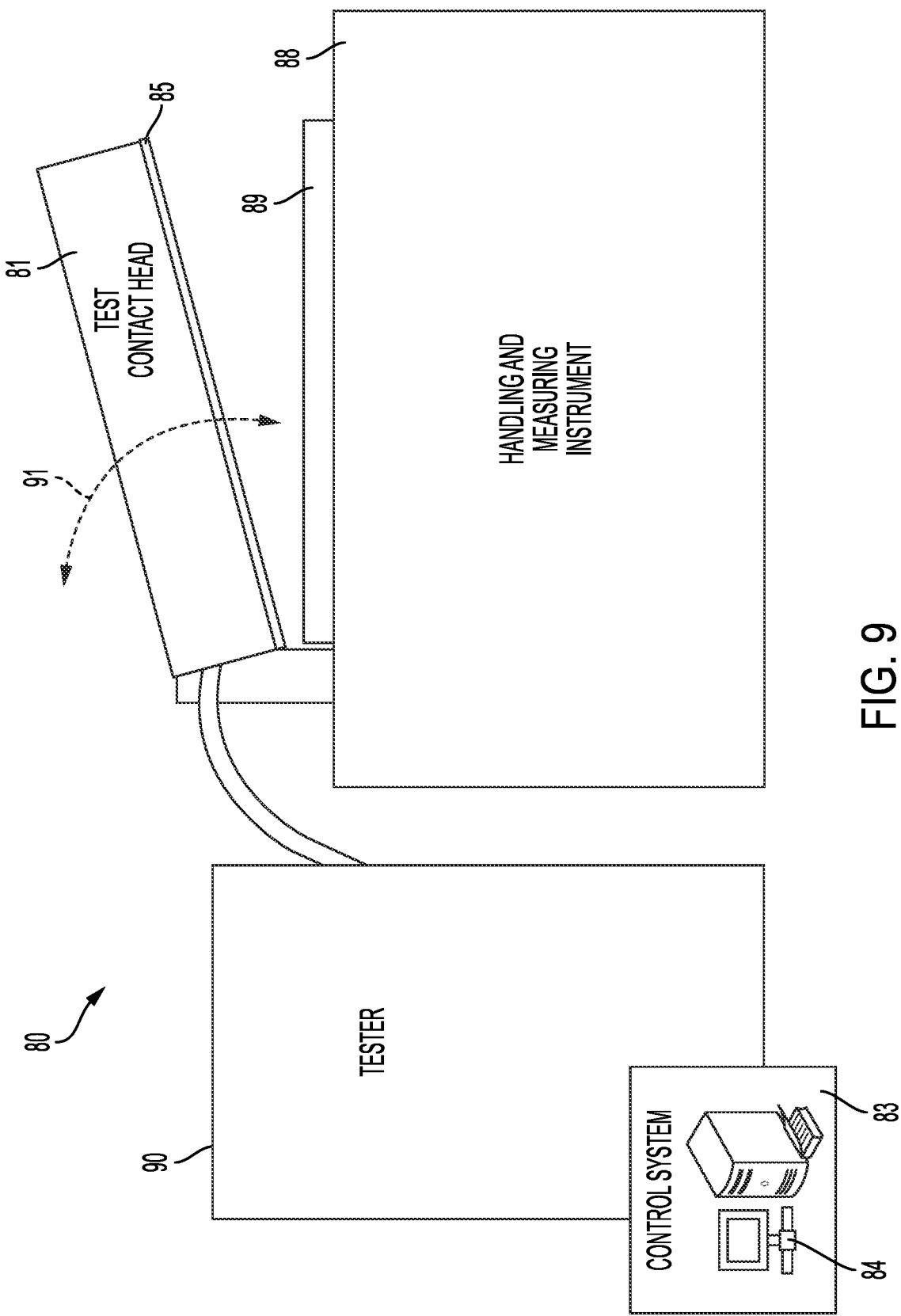
FIG. 9 is a block diagram of an example test system.

FIG. 9 shows components of automatic test equipment (ATE) 80 that includes a test contact head 81 connected to a contact card 85, which is a PIB in this example, and which includes multiple contact heads such as contact head 30 (FIG. 2). In this regard, a test contact head (as shown in FIG. 9) is distinct from a contact card such as probe card or a socket board. The contact card is latched to the test contact head and electrical contacts exist between the test contact head and the contact card to transmit the signals between the two environments. The contact contains multiple contact heads of the type described herein.

One or more of the contact heads includes one or more coaxial head contacts of the type described herein, such as head (coaxial) contact 10. ATE 80 also includes control system 83, which may include an internal or external computing system 84 that includes one or more microprocessors or other appropriate processing devices as described herein.

PIB 85 is a contact card that is connected to test contact head 81 directly or indirectly and that includes mechanical and electrical interfaces to one or more of the contact heads and coaxial connections as described herein. PIB 85 includes conductive traces through which test signals, response signals, voltage signals, and other signals may pass through test channels between DUTs held, for example on chucks 89, on handling and measuring instrument 88. In this example, test contact head 81 is connected to tester 90, which may hold one or more test instruments to generate signals for testing and to receive response signals based on the test. Test contact head 81 is movable, for example in the directions of arrow 91, so that it or the contact card can be serviced.

Control system 62 may be configured to communicate with components of the test contact head to control testing. For example, control system 62 may download test program sets to test instruments, which may be located in test contact head 81, tester 90, and/or instrument 88. The test instruments include hardware devices that may include one or more processing devices and other circuitry. The test instruments may run the test program sets to test DUTs in communication with the test instruments. Control system 83 may also send, to test instruments in the test contact head, instructions, test data, and/or other information that are usable by the test instruments to perform appropriate tests on DUTs interfaced contact heads. In some implementations, this information may be sent via a computer or other type of network or via a direct electrical path. In some implementations, this information may be sent via a local area network (LAN) or a wide area network (WAN).

A test program generates a test flow (a set of instructions) to provide to the DUT. The test flow is written to output signals to elicit a response from the DUT, for example. The test flow may be written to output signals including RF and digital signals, to receive RF and digital responses to those signals from the DUTs, and to analyze the response to determine if a device passed or failed testing.

System 80 may include any appropriate number of test instruments. In some implementations, one or more test instruments may be configured to output RF signals and/or digital signals to test a DUT based, e.g., on data provided by the control system, and to receive response signals from the DUT. Different test instruments may be configured to perform different types of tests and/or be configured to test different DUTs. The received signals may include response signals that are based on the test signals and/or signals that originate from the DUT that are not prompted by (e.g., are not in response to) test signals. As described with respect to FIG. 6, there may be coaxial transmission lines between the test contact head and the contact heads for transmitting RF signals.

Signals may be sent to, and received from, the DUT over multiple test channels. Each of these test channels may include one or more signal transmission lines or other wired or wireless transmission media. In some examples, a test channel may be defined by the physical transmission medium or media over which signals are sent from the test instrument to a DUT and over which signals are received from the DUT. In some examples, a test channel may be defined by a range of frequencies over which signals are transmitted over one or more physical transmission media. A test channel may include coaxial connections.

All or part of the test systems and processes described in this specification and their various modifications may be configured or controlled at least in part by one or more computers such as control system 83 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the voltage source, the test system, and processes described herein can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

An "electrical connection" as used herein may be or include a direct physical connection or a wired or wireless connection that includes or does not include intervening components but that nevertheless allows electrical signals to flow between connected components. Any "connection" involving electrical circuitry that allows signals to flow, unless stated otherwise, is an electrical connection and not necessarily a direct physical connection regardless of whether the word "electrical" is used to modify "connection".

The devices, methods, and systems described herein are not limited to use for wafer-level testing or package-level testing. Rather, the devices, methods, and systems described herein may be used in any appropriate testing context.

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A contact head comprising:
   coaxial contacts configured for transmission of radio frequency (RF) signals or digital signals between a test system and a device under test (DUT), each of the coaxial contacts being configured to target a specific impedance, and each of the coaxial contacts comprising:
   a coaxial structure having an open-curve shape, where a curvature of the open-curve shape is between two ends of the coaxial structure, the coaxial structure comprising a spring material that bends in response to applied force and that returns to the open-curve shape absent the applied force, the coaxial structure comprising a center conductor terminating in a contact pin and a return conductor separated by a dielectric from the center conductor, at least part of the center conductor and the return conductor comprising an electrically-conductive material; and
   flexible contacts comprising the electrically-conductive material, the flexible contacts being electrically connected to the return conductor.

2. The contact head of claim 1, wherein the coaxial structure creates an impedance-controlled environment that supports substantially lossless transmission of the RF signals or the digital signals.

3. The contact head of claim 1, wherein the coaxial structure is one of rectangular or circular in cross-section.

4. The contact head of claim 1, wherein the dielectric comprises air.

5. The contact head of claim 1, wherein the dielectric comprises polytetrafluoroethylene (PTFE).

6. The contact head of claim 1, wherein the dielectric comprises a mix of non-conductive dielectric material and air.

7. The contact head of claim 1, wherein the dielectric comprises alternating dielectric materials.

8. The contact head of claim 1, wherein the electrically-conductive material is plated over the spring material.

9. The contact head of claim 8, further comprising a precious metal plated over the electrically-conductive material.

10. The apparatus of claim 1, wherein the spring material is plated over the electrically-conductive material.

11. The contact head of claim 1, wherein the spring material comprises nickel or nickel-cobalt.

12. The contact head of claim 1, wherein the electrically-conductive material comprises copper.

13. The contact head of claim 1, wherein the coaxial structure is configured to enable substantially lossless transmission of signals that exceed 10 gigahertz (GHz) in frequency.

14. The contact head of claim 1, wherein the dielectric comprises air and a solid dielectric material to support the inner conductor.

15. The contact head of claim 1, wherein the contact head is for a single die.

16. The contact head of claim 1, further comprising:
   spring contacts configured for transmission of at least one of power or control signals between a test system and the DUT.

17. An apparatus comprising:
   multiple contact heads, each of the multiple contact heads comprising:
   the contact head of claim 1; and
   first alignment features; and
   a retention plate configured to maintain the multiple contact heads in a predefined spatial relationship, the retention plate comprising second alignment features that mate to the first alignment features.

18. The apparatus of claim 17, wherein the retention plate is comprised of a rigid material.

19. The apparatus of claim 18, wherein the rigid material comprises borosilicate glass.

20. The apparatus of claim 17, wherein each of the multiple contact heads comprise a support block to hold the coaxial structure and the first alignment features; and
   wherein the retention plate is comprised of a material having a same coefficient of thermal expansion as a material comprising a device to be contacted by a contact head.

21. The apparatus of claim 17, wherein the retention plate comprises holes, each of the holes for fitting at least part of one of the multiple contact heads.

22. The apparatus of claim 17, wherein each of the multiple contact heads comprises three first alignment features configured to mate to three corresponding second alignment features on the retention plate.

23. The apparatus of claim 17, wherein each of the multiple contact heads comprises multiple first alignment features configured to mate to multiple corresponding second alignment features on the retention plate.

24. The apparatus of claim 17, wherein the retention plate is removable to enable replacement of at least one of the contact heads.

25. The apparatus of claim 17, wherein each of the multiple contact heads comprises coaxial connectors configured to connect to mating coaxial connectors for transmission of radio frequency (RF) signals or digital signals.

26. The apparatus of claim 25, further comprising:
an interface board through which each of the mating coaxial connectors passes, the interface board being configured to hold the mating coaxial connectors without signals therethrough passing through conductive paths located on the interface board.

27. The apparatus of claim 17, wherein the dielectric comprises air.

28. The apparatus of claim 17, wherein the dielectric comprises polytetrafluoroethylene (PTFE).

29. The apparatus of claim 17, wherein the electrically-conductive material is plated over the spring material.

30. The apparatus of claim 17, further comprising a precious metal plated over the electrically-conductive material.

31. The apparatus of claim 30, wherein the spring material comprises nickel or nickel-cobalt, the electrically-conductive material comprises copper, and the precious metal comprises gold.

32. The apparatus of claim 30, wherein the spring material comprises nickel-cobalt and the precious metal comprises gold.

33. The contact head of claim 1, wherein the coaxial contacts are coaxial probes.

34. The contact head of claim 1, wherein the contact head is a probe head.

35. The contact head of claim 1, wherein the coaxial contacts are configured for wafer-level testing.

36. The contact head of claim 1, wherein the coaxial contacts are configured for package-level testing.

37. The contact head of claim 1, wherein the center conductor is a first center conductor and wherein the coaxial structure comprises a second center conductor terminating in a contact pin, the first center conductor and the second center conductor for supporting differential signals.

\* \* \* \* \*